United States Patent [19]

Berger et al.

[11] 4,255,725
[45] Mar. 10, 1981

[54] DIFFERENTIAL DEVICE USING CHARGE TRANSFER DEVICES, A FILTER AND DELAY LINE COMPRISING THIS DEVICE

[75] Inventors: Jean-Luc Berger; Jean-Louis Coutures, both of Paris, France

[73] Assignee: Thomson-CSF, Paris, France

[21] Appl. No.: 41,829

[22] Filed: May 23, 1979

[30] Foreign Application Priority Data

May 26, 1978 [FR] France ................. 78 15797

[51] Int. Cl.³ .................. H03H 15/02; H03H 7/30; G11C 27/00
[52] U.S. Cl. ................. 333/165; 307/221 D; 333/166; 333/173
[58] Field of Search .............. 333/165, 166, 138–140, 333/167, 173; 328/167; 307/221 R, 221 C, 221 D, 295, 304; 357/24; 364/862

[56] References Cited

U.S. PATENT DOCUMENTS

| | | | |
|---|---|---|---|
| 4,099,197 | 7/1978 | Ibrahim et al. | 307/221 D X |
| 4,123,733 | 10/1978 | Poirer | 333/165 |
| 4,145,676 | 3/1979 | Benoit-Gonin et al. | 333/165 |

Primary Examiner—Marvin L. Nussbaum
Attorney, Agent, or Firm—Roland Plottel

[57] ABSTRACT

A differential charge-transfer device for transversal filtering or delay line applications. It comprises: two charge-transfer channels which respectively receive the two signals, the difference between which is to be formed; an electrode common to both channels; means for sampling the signals in each channel, this sampling taking place at the same instants in both channels; a set of electrodes in each channel which, on the application of potentials of period T, propagate the samples to the common electrode with a relative delay equal to T/2 from one channel to the other. The signal representing the difference between the input signals is extracted at the common electrode.

14 Claims, 18 Drawing Figures

FIG_1

FIG_4

FIG_8

FIG_9

DIFFERENTIAL DEVICE USING CHARGE TRANSFER DEVICES, A FILTER AND DELAY LINE COMPRISING THIS DEVICE

This invention relates to the use of CTD, i.e. Charge Transfer Devices, for forming a differential stage. The invention also relates to the use of such a CTD differential stage for the production of charge-transfer filters and delay lines.

Some of CTD require a differential stage, as is the case for example with the output stage of so-called transversal filters. This output stage is normally formed by means of an external differential amplifier or even by means of MOS-transistors integrated on the same substrate as the filter itself. However, these constructions are attended by various drawbacks, including their bulkiness in the case of an external differential amplifier, or their high power consumption, in the case of a MOS-output stage, the power consumption of MOS-transistors being very much greater than that of CTD, and the non-linearities introduced by the MOS-transistors.

In order to obviate these drawbacks, it has been proposed to form the differential stage by means of the charge-transfer technique. In particular, it is known from U.S. Pat. No. 4,123,733 to THOMSON-CSF that the differential output stage of a filter can be integrated in the filter by connecting two phase-opposed filters in parallel. The drawbacks of this solution are primarily its bulkiness (it requires two identical filters) and its special nature: it is not possible in this structure to isolate a differential stage usable in another charge-transfer device.

The present invention relates to a differential charge-transfer device which does not have any of these drawbacks and which may be used for various applications.

According to the invention, there is provided a differential device using charge-transfer devices for forming the difference between two electrical input signals, comprising:

a semi-conductor substrate in which electrical charges are capable of being transferred;

at least two electrically insulated channels formed in said substrate which respectively receive said two input signals;

first means for forming at the same instants in each of the channels groups of electrical charges representing samples of said input signals;

at least one electrode common to said two channels;

second means comprising transfer electrodes deposited on said substrate substantially parallel to one another, to which are applied periodic charge-transfer signals ($\phi_1$, $\phi_2$) controlling said transfer of charges, said second means propagating said groups of charges in each of said channels towards said common electrode with a relative delay from one channel to the other equal to half the period (T/2) of said charge-transfer signals;

means for extracting from said common electrode an output signal which is proportional to the difference between the two input signals.

For a better understanding of the invention and to show how it can be carried into effect, reference will be made to the following description in conjunction with the accompanying drawings, wherein:

FIG. 1 is a plan view of one embodiment of the differential device according to the invention;

FIG. 4 shows an embodiment of an element of the device shown in FIG. 1;

FIG. 5 shows a first application of the device according to the invention to a transversal charge-transfer filter;

FIG. 6 shows a second application of the device according to the invention to a transversal charge-transfer filter;

FIG. 7 illustrates another application, in this case to a filter having coefficients of very low value;

FIG. 8 shows an application of the filter according to the invention to the correction of the output signal of a charge-transfer delay line;

FIG. 9 is a variant embodiment of the preceding figure.

In these various figures, the same references denote the same elements.

FIG. 1 is a plan view of the device according to the invention.

Like any known charge-transfer device, it is formed by a semi-conductor substrate (for example of silicon) coated with an insulating layer (for example of silicon oxide) denoted by the reference 3. The semi-conductor substrate is formed with two electrically insulated and substantially parallel channels 1 and 2 in which electrical charges can be longitudinally transferred. These channels may be insulated by any known means, in particular by an increase in the thickness of the insulating layer or by a local increase in the doping of the substrate.

The device further comprises electrodes deposited on the insulating layer substantially normally to the direction in which the charges are transferred in the channels 1 and 2.

In this embodiment, the channel 1 successively carries: a diode $D_{11}$; electrodes $G_{EC1}$, $G_{E1}$, 11, 12, $G_T$, $G_L$, 13 and 14 and a diode $D_{12}$. The channel 2 successively comprises a diode $D_{21}$; electrodes $G_{EC2}$, $G_{E2}$, 21, 22, 23, 24, $G_T$ and $G_L$ common to the two channels 25 and 26 and a diode $D_{22}$.

The various diodes are for example P-N junctions formed by doping the substrate. The diodes $D_{11}$ and $D_{21}$ are used for injecting the signals ($E_1$ and $E_2$), between which the difference is to be generated, into the channels 1 and 2, respectively. The diodes $D_{12}$ and $D_{22}$ are connected to a biassing potential $V_{DD}$ and are used for removing the charges at the end of their path.

FIG. 2a is a section through the device shown in FIG. 1 taken along the channel 1 in the propagation direction of the electrical charges. This section shows the semi-conductor substrate (4) covered by the insulating layer (5). The substrate 4 is formed with two zones opposite in conductivity to the substrate which, with the substrate, form the diodes $D_{11}$ and $D_{12}$. The substrate is brought to the most negative potential of the device which represents the reference potential (earth) in relation to which the other potentials are expressed.

It should also be noted that, throughout the description, the semi-conductor substrate is of P-type conductivity and that the charges transferred are minority carriers (electrons). It is obvious that, in the case of an N-type substrate where it is these holes which move, it is sufficient to reverse the polarity of all the potentials applied.

Figure 2:
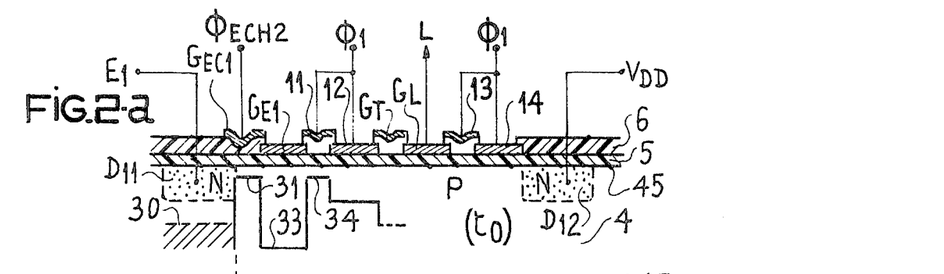
FIG. 2a to 2f are diagrams explaining the operation of the device shown in FIG. 1.

It can be seen from FIG. 2 that the electrodes $G_{E1}$, 12, $G_L$ and 14 are deposited on the insulating layer 5 whilst the electrodes $G_{EC1}$, 11, $G_T$ and 13 are deposited on a thickened part 6 of the insulating layer. The same applies to the channel 2 where one electrode of two is deposited on a thickened part of the insulating layer, beginning with the electrode $G_{EC2}$. As already known, this arrangement has a two-fold function; on the one hand to ensure the continuity of the potential wells created in the semi-conductor 4 and, on the other hand, to impose a single transfer direction for the charge-carriers. This structure comprising an increase in the thickness of the insulating layer could be replaced by an increase in the doping of the substrate by ion implantation which performs the same functions.

Figure 3:
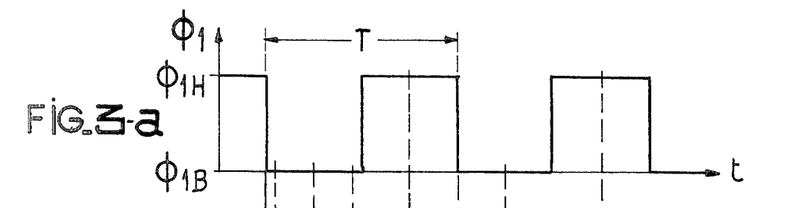
FIGS. 3a to 3e are diagrams of signals capable of being applied to the device shown in FIG. 1.

The diagrams of FIG. 3 show the signals capable of being applied to the device illustrated in FIG. 1 as a function of time.

Diagram (a) shows a potential $\phi_1$ applied to the electrodes 11, 12, 13, 14, 21 and 22. It is a square function of period T, its amplitude varying between $\phi_{1B}$ (lower level) and $\phi_{1H}$ (upper level).

Diagram (b) shows a potential $\phi_2$ applied to the electrodes 23, 24, 25 and 26. It is also a square function and its amplitude varies between $\phi_{2B}$ (lower level) and $\phi_{2H}$ (upper level). It is preferably identical with $\phi_1$, but phase-shifted by T/2 in relation thereto.

Diagram (c) shows a potential $\phi_{ECH2}$ applied to the electrodes (or gates) $G_{EC1}$ and $G_{EC2}$. The signal in question is a rectangular signal varying between $\phi_H$ and $\phi_B$ which has the same period T as the preceding signals but for which the duration of the lower level ($\phi_{ECH2} = \phi_B$) is greater than T/2. In addition, the front of $\phi_{ECH2}$ is delayed in relation with the front of $\phi_2$ by a duration of less than T/4.

Diagram (d) shows a potential $\phi$hd ECH1 in the form of a square signal which has substantially the same form as $\phi$ECH2 but is phase-shifted by T/2 in relation thereto.

Diagram (e) shows a square potential $\phi_P$ the amplitude of which varies between $\phi_{PH}$ and $\phi_{PB}$ with a period T and the front of which is preferably located between the back front of $\phi_{ECH1}$ and the back front of $\phi_1$.

The potentials $\phi_{ECH1}$ and $\phi_P$ are applied to an element L connected to the electrode $G_2$. This element reads the quantity of charges existing under the electrode $G_L$ during the upper level ($\phi_H$) of $\phi_{ECH1}$ and fixes the potential of this same electrode at the value $\phi_{PH}$ before the reading phase.

One embodiment of an element such as this is shown in FIG. 4. It comprises at least two transistors $T_P$ and $T_E$, for example of the enhanced MOS-type, which are connected as follows: one terminal of $T_P$ is connected to one terminal of $T_E$ and to the gate $G_L$; the second terminal of $T_P$ is connected to a constant potential $V_P$ and the gate of $T_P$ is connected to $\phi_P$; the gate of $T_E$ is connected to $\phi_{ECH1}$. The second terminal of $T_E$ is preferably connected to the gate of a third transistor $T_S$, for example of the enhanced MOS-type; one terminal of $T_S$ is connected to a constant potential of relatively high value ($V_{DD}$); the second terminal of $T_S$ supplies the reading signal S and is connected to earth through a resistive element which may be formed for example by a MOS depletion transistor $T_R$: one terminal of $T_R$ is connected to $T_S$, the other terminal of $T_R$ and its gate being connected to earth.

In order to make the operation of the device clearer, FIG. 2a shows the state of the potential well generated in the substrate 4 by the application of different signals at an instant $t_o$.

Under the diode $D_{11}$, the application of the signal $E_1$ corresponds to a potential level illustrated in the figure by a line 30. At the instant $t_o$, illustrated in the diagrams of FIG. 3, $\phi_{ECH2} = \phi_B$ at the gate $G_{EC1}$ (line 31) which prevents charges from being transferred in the rest of the channel.

Diagram (b) of FIG. 2 shows only the interface 45 of the substrate 4 with the insulating layer 5 and the state of the potential well at a later instant $t_1$. At the gate $G_{EC1}$, the potential $\phi_{ECH2}$ has passed to the value $\phi_H$ (line 32). In addition, the gate $G_{E1}$ is kept at a potential $V_E$ which corresponds to a potential level 33 in the figure. The potential $V_E$ may be constant or periodic, but must always be greater than the input signal $E_1$ when it is injected, i.e. when $\phi_{ECH2} = \phi_H$. At the instant $t_1$, when the potential $\phi_1$ applied to the electrode 11 is still at the level $\phi_{1B}$ (line 34), thus preventing the charges from being transferred in the rest of the channel, the level of the charges remaining (line 30) below the only electrodes $G_{EC1}$ and $G_{E1}$.

Diagram (c) represents the instant $t_2$: the potential $\phi_1$ at the electrode 11 is still at the level $\phi_{1B}$ (line 34), but the potential $\phi_{ECH2}$ at the electrode $G_{EC1}$ has returned to the level $\phi_B$ (line 31), thus isolating below the electrode $G_{E1}$ a quantity of charges A defined by the difference between the potential $V_E$ and the signal $E_1$ at the instant $t_1$, i.e. representing a sample of the signal $E_1$ at the instant $t_1$.

Diagram (d) shows the transfer of the sample A below the electrode 12: at the instant $t_3$, the potential $\phi_1$ passes to the level $\phi_{1H}$, thus inducing two different levels 35 and 36 below the electrodes 11 and 12, due to the fact that the electrode 11 is deposited on a thickened part of the insulating layer (6). However, the sample A cannot pass beyond the electrode 12 because of the gate $G_T$ which is kept at a constant potential $V_G$ (line 37 in the diagram).

At a later instant $t_4$, before the signal $\phi_1$ has returned to the level $\phi_{1B}$ in a step not shown in FIG. 2, the signal $\phi_P$ passes to the level $\phi_{PH}$ whereas $\phi_{ECH1}$ is at the lower level ($\phi_B$) (see FIG. 3). The effect of this is to fix the potential of the electrode $G_L$ at a level $V_P$ by the action of the transistor $T_P$ shown in FIG. 4.

Diagram 2e shows the transfer of the sample A below the electrode $G_L$ at an instant $t_5$, the electrode $G_L$ still being kept at the potential $V_P$ (line 39). This transfer is allowed by the return of $\phi_1$ to the level $\phi_{1B}$ on the electrodes 12 and 13 surrounding the gate $G_L$. At the same time a second sample (B) begins to be formed in a phase similar to phase (b) at the instant $t_1$ for the sample A.

Diagram 2f represents the step in which the quantity (A) of charges existing below the gate $G_L$ is read at an instant $t_6$.

Since the potential $\phi_1$ passes to the level $\phi_{1H}$, the charges in the channel 1 are removed towards the diode $D_{12}$ whereas, in the channel 2, the charges arrive below the electrode $G_L$. This is because the channel 2 comprises one pair of electrodes more than the channel 1 between the electrodes 21 and 22 and the gate $G_T$, controlled by the potential $\phi_2$. Because the potential of the gate $G_L$ has floated since $\phi_P = \phi_{PB}$ (instant $t_6$), it is thus fixed at a value proportional to the difference between the quantity of charges which arrives (channel 2) and the quantity of charges which leaves (channel 1). The potential $\phi_{ECH1}$ enables the information to be extracted at this instant from the sampling MOS $T_E$. In addition, so far as the sample B is concerned, the instant $t_6$ corresponds to the instant $t_3$ for the sample A.

At the following instant, the charges in the channel 2 (sample B) are removed by the potential $\phi_2$ and a new group of charges arrive below $G_L$ through the channel 1.

In the device described above, the value of the amplitude $\phi_{1H}$ has to be large in relation to the value of the potential $V_P$ applied to the gate $G_L$ to enable all the charges to be evacuated at the instant $t_6$. This may be achieved by regulating $V_P$.

However, two variants are possible which eliminate the need for a large relative value between $\phi_{1H}$ and $V_P$:

the first consists in providing a conductive diffusion between the gate $G_L$ and the electrode 14, the electrode 13 being eliminated; this diffusion forms a reservoir for charge carriers of which the level is aligned with that of the highest potential;

the second may be used when, contrary to the foregoing, a dissymmetry is created by a known technique in the charge-transfer direction by local overdoping (for example by ion implantation); in this case, the overdoping is omitted below the electrode 13.

The differential device described above thus samples the two input signals ($E_1$ and $E_2$) at the same instants ($\phi_{ECH2} = \phi_H$ at the period T), the corresponding samples arriving at a common electrode ($G_L$) with a phase shift of T/2 which is introduced by the difference in the number of transfer electrodes respectively placed on each channel. By virtue of this arrangement, it is possible simultaneously to obtain automatic differentiation of the signals, because they arrive in phase opposition at the electrode ($G_L$) where they are read, and to avoid external maintenance of the signals for half a period which would be necessary if sampling were carried out with a relative delay of T/2 in each channel.

FIG. 5 shows a first application of the device according to the invention to a transversal charge-transfer filter using the technique of charge-coupled devices (CCD's).

It will be recalled that, in a CTD filter, the signal has to be sampled, passed through a delay line comprising a discrete number N of stages, extracted at the level of each stage and given a weighting coefficient $h_i$ ($1 \leq i \leq N$) dependent upon the required filtration, after which the signals thus produced are algebraically added to obtain the filtered signal.

In the interests of simplicity, FIG. 5 shows only the electrodes of the filter which are conventionally insulated from one another, being deposited on a semi-conductor substrate covered by an insulating layer. The filter comprises N=5 stages formed by 5 substantially parallel channels, the width of the channels varying with the weighting coefficients: it has the form $h_i \cdot l$, where:

$h_i$ is the dimensionless coefficient $1 \leq i \leq 5$ $l$ is the unit width.

Accordingly, a quantity of charges proportional to the coefficient $h_i$ circulates in each channel. Each channel comprises a stage ($I_1 \ldots I_5$) for injecting charges into the channel, represented in the figure by a dotted-line block symbolising the diode D and the gates $G_{EC}$ and $G_E$ described above; an assembly of transfer electrodes alternately connected to the preceding potentials $\phi_1$ and $\phi_2$, their number being dependent upon the order of the channel and upon the sign of the required weighting coefficient. As in the device shown in FIG. 1, the gates $G_T$ and $G_L$ extend over all the channels, the first gate $G_T$ being kept at the potential $V_G$ and the second gate $G_L$ being connected to the element L. Again as in FIG. 1, each channel comprises, after the gates $G_T$ and $G_L$, a transfer electrode followed by a charge removal diode (not shown).

It should be noted that in this figure, as in the following figures, a "transfer electrode" is understood to be a pair of two electrodes such as 11 and 12 or 23 and 24 in FIG. 1 connected to the same potential $\phi_1$ or $\phi_2$.

With regard to the delay imposed on the input signal in each channel, it is of course dependent upon the number of transfer electrodes which the channel in question comprises, two successive electrodes controlled respectively by $\phi_1$ and $\phi_2$ introducing a delay T. Accordingly, for each stage to impose an additional delay T in relation to the preceding stage, the corresponding channel must comprise two additional transfer electrodes. This is illustrated in FIG. 5 where the second channel for example comprises after the injection stage $I_2$ two electrodes ($\phi_2$ and $\phi_1$) more than the first channel which only comprises one ($\phi_1$).

The sign of the weighting coefficients may be positive or negative. By applying the principle of the differential stage of FIG. 1, the signal E is injected in phase, that is to say at the same instant, in all the channels and an additional transfer electrode is added to the channels representing positive coefficients. In this way, the groups of charges corresponding to the coefficients of like sign are added together and subtracted from the groups of charges representing coefficients of opposite sign due to the fact that they rejoin the common electrodes $G_T$ and $G_L$ with a relative delay of T/2. Accordingly, the output signal $S_F$ of the filter is obtained at the output of the block L.

An arrangement such as this has the following advantages over other known transversal filters:

on the one hand, it can be completely integrated on the same substrate, including the differential stages;

on the other hand, it avoids the extraction and output of the signal from the charge-transfer device before the sum signal $S_F$ is obtained.

FIG. 6 shows another application of the device according to the invention to a transversal charge-transfer filter.

As in the preceding figure, only the electrodes of the filter are shown. In addition, the same coefficients as in FIG. 5 with the same number of stages (N=5) have been selected in the interests of simplicity.

In this case, the injection stage (I) is common to all the channels in the same way as the first transfer electrode controlled by the potential $\phi_1$. However, the channels are insulated from one another, for example by insulating diffusions (lines 41 to 44 in the figure) which begin below the electrode $\phi_1$ in order to obtain greater precision, as soon described.

The first channel of width $h_1 \cdot l$ comprises, after electrodes $G_T$ and $G_L$, a transfer electrode $\phi_1$ followed by a diode (not shown). In order to impose on the charges a delay T relative to the charges of the first channel, the second channel comprises, in addition to the electrode $\phi_1$ common to all the channels and the gates $G_T$ and $G_L$, two additional transfer electrodes ($\phi_2$ and $\phi_1$) which are common to the four remaining channels, etc.

The various gates $G_L$ are interconnected towards the reading block L to supply the output signal of the filter, the sign of weighting coefficients of the filter being obtained in the same way as in the device shown in FIG. 5 by a phase shift of T/2.

In this embodiment, it is possible if necessary to add a delay line to the filter. This delay line is formed by a certain number of pairs of transfer electrodes ($\phi_1$, $\phi_2$) common to all the channels and placed between the injection stage I and the transfer electrode below which the channels are separated.

FIG. 7 shows another application of the device according to the invention which enables filtering to be carried out with coefficients of very low value.

In the same way as before, FIG. 7 shows a filter with N channels (N=5) comprising an injection stage (I) and a first common transfer electrode ($\phi_1$), the channels being separated below this electrode.

In this embodiment, all the channels have the same width (l), but are each subsequently divided into two parts (L+ and L−) proportional to $(1+h_k)/2$ and $(1-h_k)/2$, respectively, after $(k-1)$ transfer stages ($k \leq N$). Each channel then comprises a differential stage corresponding to that shown in FIG. 1. The part of width L+ undergoes an additional transfer before arriving at the gates $G_T$ and $G_L$, of which only the gate $G_L$ is shown in the interest of simplicity. The gates $G_L$ of all the channels are connected together to the reading block L to give the output signal $S_F$.

In this embodiment, the width of the electrodes is greater, the lower the value of the coefficients with $L_k^+ = L_k^- = l/2$ for $h_k = 0$. Accordingly, this structure is particularly advantageous for filters having coefficients of very low value on account of the technological impossibility of forming very narrow channel widths (less than 5 um for example).

The filters described in the preceding figures may be used in particular for the correction which is necessary at the output end of a charge-transfer delay line.

As already known, the attenuation of a signal propagated in a line such as this is an increasing function of the frequency of the signal, this attenuation being greater, the higher the clock frequency of the line, which constitutes a limit to the increase of this frequency. In order to overcome this drawback, it is standard practice for the delay line to be followed by a filter the function of which is to render the attenuation uniform for all the frequencies of the signal up to half the clock frequency.

FIG. 8 shows one application of the charge-transfer filter according to the invention to such a correction. This application has the advantage of enabling the delay line and the corrective filter to be integrated on the same substrate.

FIG. 8 shows by way of example one end of a charge-transfer delay line 50 successively comprising the last two transfer electrodes ($\phi_2$ and $\phi_1$), an output gate ($G_s$) parallel with the preceding electrodes, a diode $D_1$, a transfer electrode ($\phi_1$) and a second diode $D_2$. The output signal ($S_R$) of the line is obtained at the diode $D_1$ and feeds the gate of an MOS-transistor 52. A relatively high voltage, for example the preceding voltage $V_{DD}$, biasses the diode $D_2$ and feeds one of the terminals of the MOS-transistor 52, the other terminal (53) of this transistor being connected to earth through a rheostat R.

The device shown in FIG. 8 comprises a filter 51 similar to the filter shown in FIG. 5, for example having three coefficients (−a, b=1, −a), but with channels of identical width. The second channel which alone represents a positive coefficient imposes a phase shift of T+T/2 in relation to the first channel. At its injection stage ($I_2$), it receives the signal available at the point 53 which represents the filtering coefficient equal to 1. The third channel has a phase shift of 2 T in relation to the first channel. At its injection stage ($I_3$), it receives the same signal as the first channel supplied by the slide 54 of the rheostat R which represents the filtering coefficient a.

One of the advantages of this embodiment is that the adjustment of the rheostat R enables the value of the coefficient a, i.e. the response of the filter, to be adjusted.

FIG. 9 shows a variant of the device illustrated in the preceding figure which may be used when the coefficients (a, b) of the corrective filter are known in advance and which provides for a more compact construction.

FIG. 9 shows the last four transfer electrodes ($\phi_2$, $\phi_1$, $\phi_2$, $\phi_1$) of a charge-transfer delay line of which the channel has a width l. Under the last electrode $\phi_1$, the channel is divided into three channels of which the widths are, respectively, a.l, b.l, and a.l with $2a+b=1$, so as to form a filter similar to that shown in FIG. 6. In the same way as before, the second channel represents a positive filtering coefficient, whereas the other two represent negative coefficients and, hence, have a phase shift of T/2 in relation to the second channel.

As in FIG. 6, the gates $G_L$ of each channel ($G_{L1}$, $G_{L2}$ and $G_{L3}$) are joined together and connected to the block L to supply the delayed and filtered signal.

One advantage of this embodiment is that there is no need for the signal to be extracted between the delay stage and the correction stage.

In the same way as shown in FIGS. 8 and 9, the filter shown in FIG. 7 may also be used in combination with a delay line for correcting the delayed signal.

What is claimed is:

1. A differential device using charge-transfer devices for forming the difference between two electrical input signals, comprising:
   a semi-conductor substrate in which electrical charges are capable of being transferred;
   at least two electrically insulated channels formed in said substrate which respectively receive said two input signals;
   first means for forming at the same instants in each of the channels groups of electrical charges representing samples of said input signals;
   at least one electrode common to said two channels;
   second means comprising transfer electrodes deposited on said substrate substantially parallel to one another, to which are applied periodic charge-transfer signals ($\phi_1$, $\phi_2$) controlling said transfer of charges, said second means propagating said groups of charges in each of said channels towards said common electrode with a relative delay from one channel to the other equal to half the period (T/2) of said charge-transfer signals;
   means for extracting from said common electrode an output signal which is proportional to the difference between the two input signals.

2. A differential device as claimed in claim 1, wherein said extraction means apply a constant potential ($V_P$) to said common electrode on the arrival of the groups of charges in the first channel under this electrode and, then, isolate said common electrode and read its potential which results from said constant potential ($V_P$) and the quantity of charges present under said common electrode on the arrival of the group of charges in the second channel and on the departure of the group of charges existing in the first channel.

3. A differential device as claimed in claim 2, wherein said extraction means comprise first and second transistors of the MOS-type; said first MOS-transistor being connected on the one hand to said common electrode and on the other hand to said constant potential ($V_P$), said first transistor being further controlled by a first potential ($\phi_P$) of the same period (T) as said charge-transfer signals ($\phi_1, \phi_2$), but phase-shifted in relation to them in such a way that said common electrode is brought to said constant potential ($V_P$) on the arrival of the groups of charges in said first channel; said second MOS-transistor being connected by one of its terminals to said common electrode and, at its other terminal, supplies the output signal (S) of the device, said second transistor being controlled by a second potential ($\phi_{ECH1}$) of the same period (T) as, but in phase opposition to, said first potential ($\phi_P$).

4. A differential device as claimed in claim 1, wherein for each channel, said first means are formed by a diode formed in said substrate, first and second electrodes, substantially parallel with said transfer electrodes, the input signal (E) of the channel being applied to said diode, said first electrode being controlled by a periodic potential ($\phi_{ECH2}$) which is identical for said two channels and which has the same period (T) as said transfer signals ($\phi_1, \phi_2$), enabling the input signal (E) to be sampled.

5. A differential device as claimed in claim 1, wherein each transfer electrode is divided into two electrodes controlled by the same transfer signal, said divided electrodes being deposited on said substrate by way of layers of electrically insulating materials differing from one another in thickness so that the transfer of charges in said substrate can only take place in one direction.

6. A differential device as claimed in claim 1, wherein said common electrode is preceded by a second common electrode kept at a constant potential so that the transfer of charges in said substrate can only take place towards said common electrode.

7. A differential device, according to claim 1, to be included in a filter, said filter using the transfer of charges in a semi-conductor for filtering an input signal by means of a number (N) of weighting coefficients, said device comprising a plurality of said insulated channels adjacent to one another and equal to the number of weighting coefficients (N) of said filter, the number of said transfer electrodes in each of said channels being such that, the groups of charges passing respectively through two adjacent channels representing coefficients of like sign, are phase-shifted relative to one another by the period (T) of said transfer signals and, that the groups of charges passing respectively through two adjacent channels representing coefficients of opposite sign are phase-shifted by an odd number of half-periods (T/2) of the transfer signals.

8. A device as claimed in claim 7, wherein said channels are substantially parallel to one another, their width defining the magnitude of the corresponding filtering coefficient, each channel comprising means for sampling said input signal of the filter and said common electrode extending over all the channels.

9. A device as claimed in claim 7, wherein said channels are substantially parallel to one another, their width defining the magnitude of the corresponding filtering coefficient, said means for sampling said input signal of the filter being common to al the channels and said common electrode being formed by as many electrodes as there are channels electrically connected to one another.

10. A device as claimed in claim 7, wherein said channels are substantially parallel to one another and equal in width, said means for sampling said input signal of the filter being common to all the channels, each of the channels being divided into two parts of which the width ratio represents the corresponding filtering coefficient, said common electrode being formed by as many electrodes as there are channel sections electrically connected to one another.

11. A device as claimed in claim 9 or 10, wherein the first transfer electrode, which is situated on the path followed by the charges after said sampling means, is also common to all the channels, the electrical insulation of the channels beginning below this electrode and being formed by insulating diffusions.

12. A delay line using charge-transfer devices, comprising the device as claimed in claim 7.

13. A delay line as claimed in claim 12, wherein said the device comprises a plurality of channels of equal width disposed substantially parallel to one another, each channel comprising means for sampling the signal applied to the channel, said common electrode extending over all the channels, the delayed signal being applied to the channels of the filter through resistive elements the resistance value of which defines the value of the filtering coefficient of the corresponding channel.

14. A delay line using charge transfer devices as claimed in claim 9 or 10, comprising transfer electrodes which extend over all the channels and which are placed in the path followed by the charges after the sampling ans.

* * * * *